United States Patent
Tani et al.

(10) Patent No.: US 9,318,645 B2
(45) Date of Patent: Apr. 19, 2016

(54) NITRIDE SEMICONDUCTOR LIGHT-EMITTING ELEMENT

(71) Applicant: Sharp Kabushiki Kaisha, Osaka-shi, Osaka (JP)

(72) Inventors: Yoshihiko Tani, Osaka (JP); Tadashi Takeoka, Osaka (JP); Akihiro Kurisu, Osaka (JP); Tetsuya Hanamoto, Osaka (JP); Mathieu Senes, Osaka (JP)

(73) Assignee: SHARP KABUSHIKI KAISHA, Osaka-Shi (JP)

( * ) Notice: Subject to any disclaimer, the term of this patent is extended or adjusted under 35 U.S.C. 154(b) by 0 days.

(21) Appl. No.: 14/394,059

(22) PCT Filed: Oct. 16, 2013

(86) PCT No.: PCT/JP2013/078042
§ 371 (c)(1),
(2) Date: Oct. 10, 2014

(87) PCT Pub. No.: WO2014/061692
PCT Pub. Date: Apr. 24, 2014

(65) Prior Publication Data
US 2015/0076447 A1    Mar. 19, 2015

(30) Foreign Application Priority Data
Oct. 19, 2012  (JP) ................... 2012-232074

(51) Int. Cl.
*H01L 33/06* (2010.01)
*H01L 33/00* (2010.01)
*H01L 33/32* (2010.01)
(Continued)

(52) U.S. Cl.
CPC ............. *H01L 33/0025* (2013.01); *H01L 33/06* (2013.01); *H01L 33/32* (2013.01); *H01L 33/12* (2013.01); *H01L 33/20* (2013.01)

(58) Field of Classification Search
CPC .......... H01L 33/06; H01L 33/08; H01L 33/32
See application file for complete search history.

(56) References Cited

U.S. PATENT DOCUMENTS

| 7,884,351 B2* | 2/2011 | Kyono et al. .................... 257/15 |
| 8,390,004 B2* | 3/2013 | Avramescu et al. ............. 257/82 |

(Continued)

FOREIGN PATENT DOCUMENTS

| JP | 2004-179428 | 6/2004 |
| JP | 2007-115753 | 5/2007 |

(Continued)

OTHER PUBLICATIONS

International Search Report mailed Nov. 12, 2013, directed to International Application No. PCT/JP2013/078042; 2 pgs.

*Primary Examiner* — Mark Prenty
(74) *Attorney, Agent, or Firm* — Morrison & Foerster LLP

(57) ABSTRACT

A nitride semiconductor light-emitting element includes a second light-emitting layer, a third barrier layer, and a first light-emitting layer from a side close to a p-type nitride semiconductor layer. The first light-emitting layer includes a plurality of first quantum well layers and a first barrier layer provided between the plurality of first quantum well layers. The second light-emitting layer includes a plurality of second quantum well layers and a second barrier layer provided between the plurality of second quantum well layers. The second quantum well layers include a multiple quantum well light-emitting layer thicker than the first quantum well layers.

4 Claims, 4 Drawing Sheets

(51) Int. Cl.
*H01L 33/20* (2010.01)
*H01L 33/12* (2010.01)

(56) References Cited

U.S. PATENT DOCUMENTS

| | | | |
|---|---|---|---|
| 8,525,148 B2 * | 9/2013 | Ren et al. | 257/13 |
| 2007/0241353 A1 | 10/2007 | Taki | |
| 2008/0035910 A1 | 2/2008 | Kyono et al. | |
| 2008/0093593 A1 | 4/2008 | Ryu | |
| 2012/0049155 A1 | 3/2012 | Tachibana et al. | |
| 2013/0001512 A1 | 1/2013 | Kotani | |

FOREIGN PATENT DOCUMENTS

| | | |
|---|---|---|
| JP | 2007-281257 | 10/2007 |
| JP | 2008-103711 | 5/2008 |
| JP | 2011-187621 | 9/2011 |
| JP | 2012-069901 | 4/2012 |

* cited by examiner

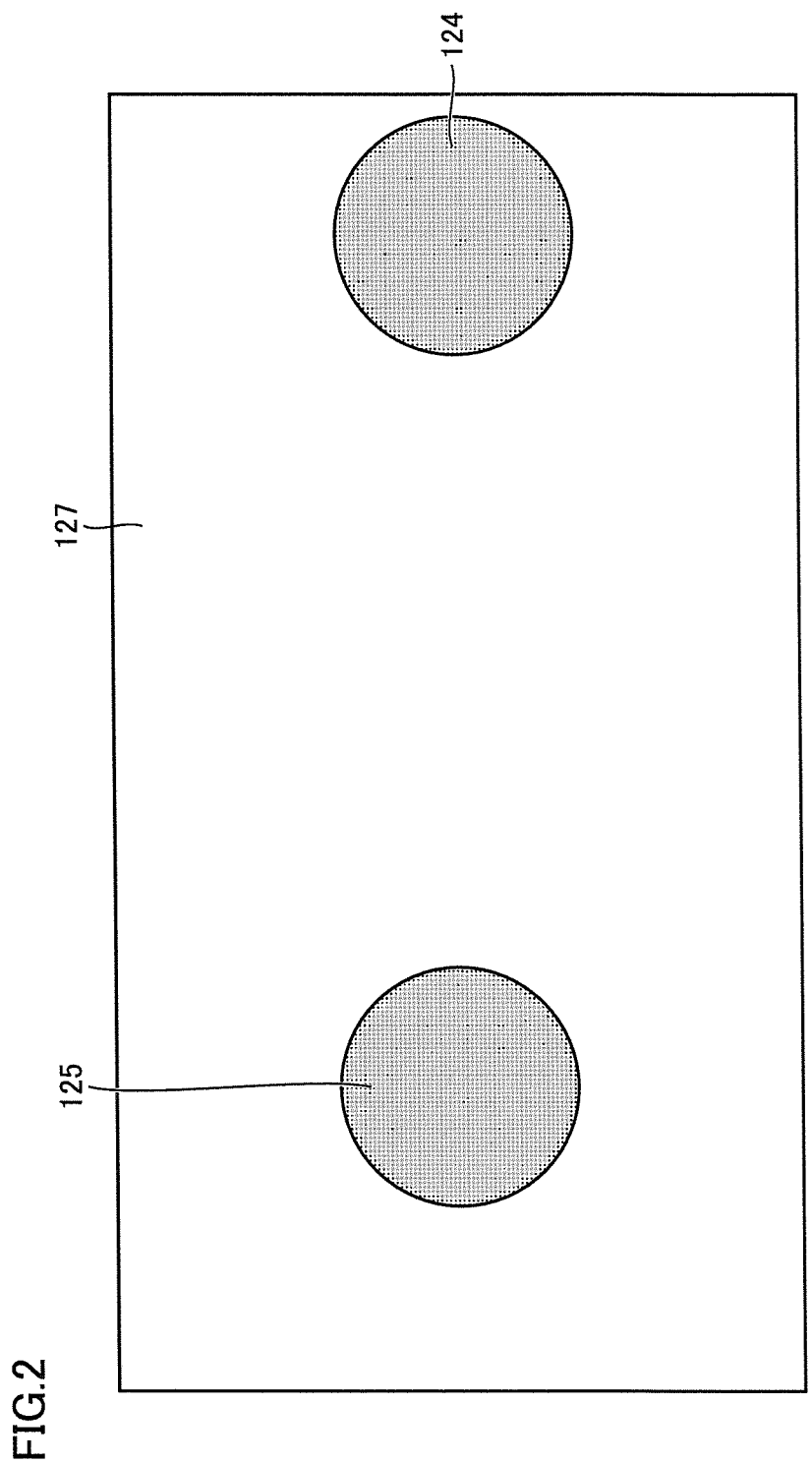

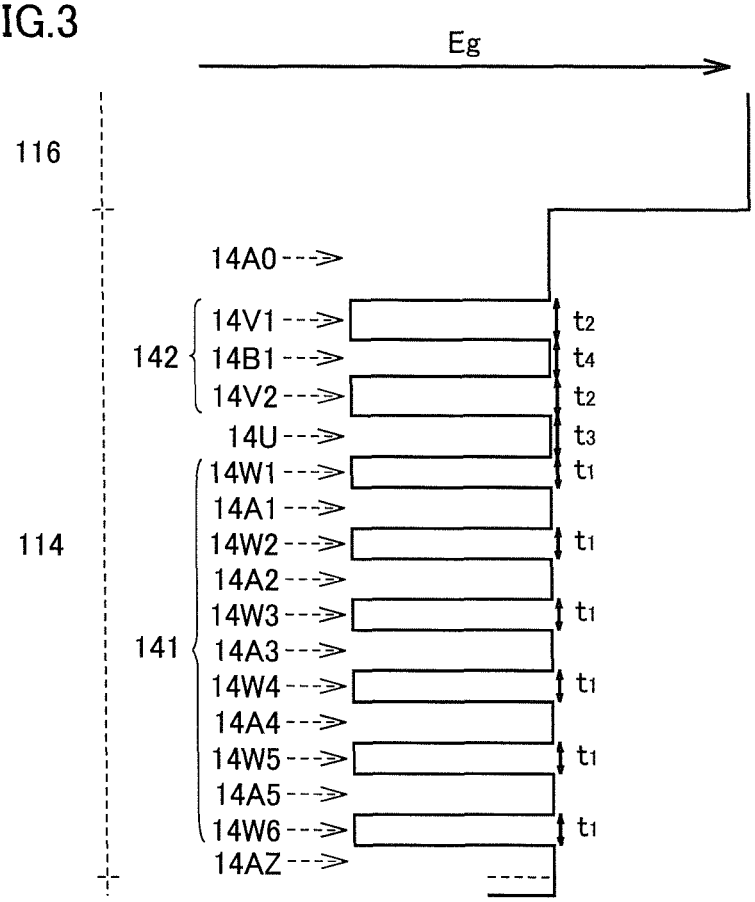

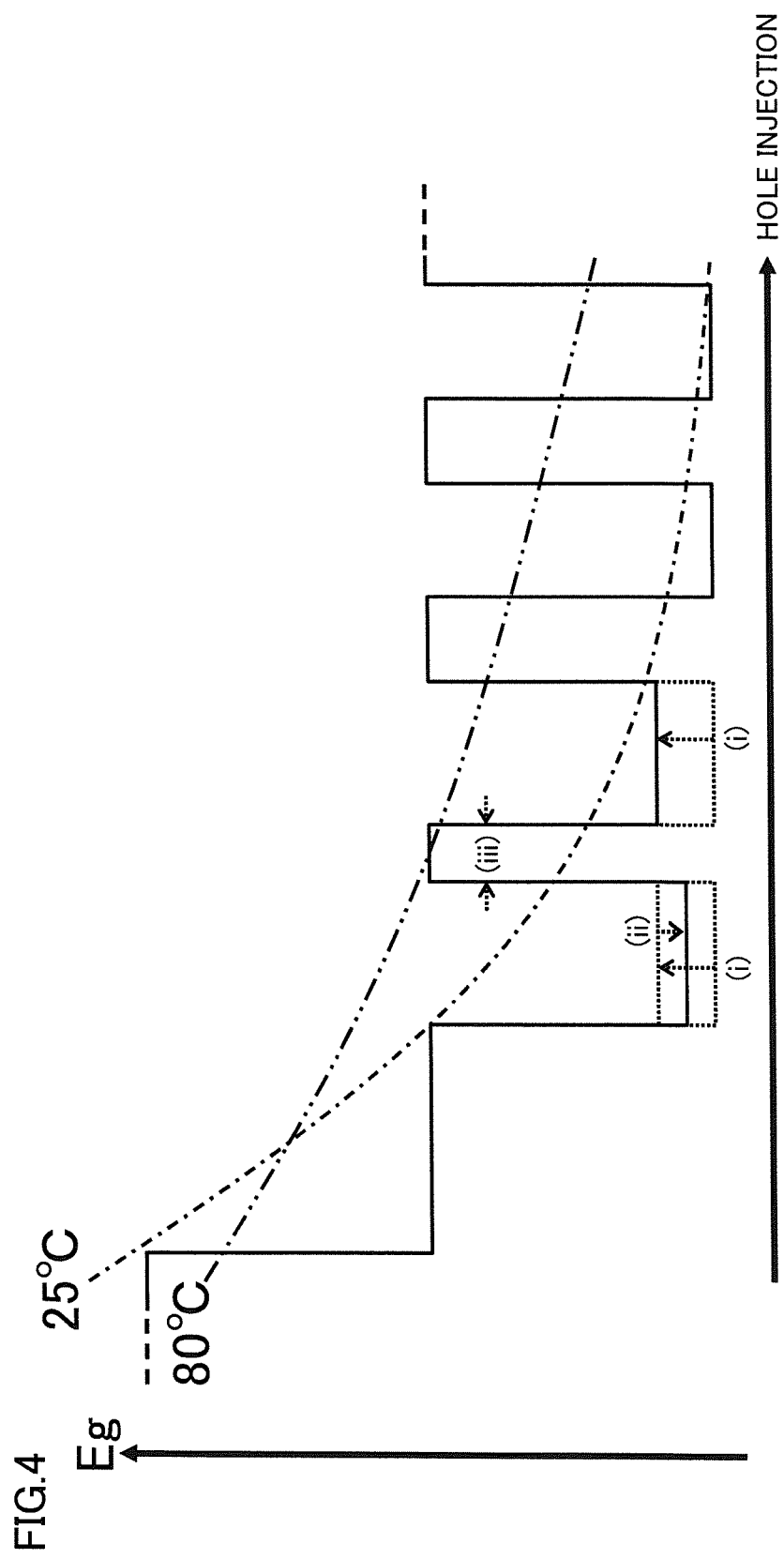

NITRIDE SEMICONDUCTOR LIGHT-EMITTING ELEMENT

CROSS-REFERENCE TO RELATED APPLICATIONS

This application is a national phase filing under 35 U.S.C. §371 of International Application No. PCT/JP2013/078042, filed on Oct. 16, 2013, and which claims priority to Japanese Patent Application No. 2012-232074, filed on Oct. 19, 2012, the contents of which prior applications are incorporated herein by reference.

FIELD OF THE INVENTION

The present invention relates to a nitride semiconductor light-emitting element.

BACKGROUND OF THE INVENTION

A III-V compound semiconductor material containing nitrogen (hereinafter, referred to as "nitride semiconductor material") has a band gap corresponding to energy of light having a wavelength ranging from an infrared region to an ultraviolet region. Therefore, the nitride semiconductor material is useful for material of a light-emitting element which emits light having a wavelength ranging from the infrared region to the ultraviolet region, material of a light-receiving element which receives light having a wavelength within those regions, and the like.

Further, the nitride semiconductor material has a high bonding strength between atoms, a high breakdown voltage, and a high electron saturation speed. Therefore, the nitride semiconductor material is also useful as material of an electronic device such as a high-frequency transistor exhibiting a high-temperature resistance and a high output. Moreover, since the nitride semiconductor material almost never damages the environment, it attracts attention also as material which can be readily handled.

The nitride semiconductor light-emitting element using the nitride semiconductor material having the characteristics described above generally employs a quantum well structure for a light-emitting layer. When a voltage is applied to the nitride semiconductor light-emitting element which employs the quantum well structure for the light-emitting layer, electrons and holes are recombined in a quantum well layer of the light-emitting layer to thereby generate light. The light-emitting layer having the quantum well structure may be constituted of a single quantum well (SQW) structure. However, a multiple quantum well (MQW) structure is often employed which has quantum well layers and barrier layers stacked alternately.

In regard to the nitride semiconductor light-emitting element which employs the quantum well structure for the light-emitting layer, several attempts have been made to obtain a desired characteristic by devising the MQW structure of the light-emitting layer.

For example, PTD 1 discloses a semiconductor light-emitting element including a light-emitting portion constituted of the MQW structure having first through eighth well layers from a side of an n-type first semiconductor layer 10, wherein the first through fourth well layers are undoped $In_{0.12}Ga_{0.88}N$ layers having a thickness of 2.5 nm, and the fifth through eighth well layers are undoped $In_{0.15}Ga_{0.85}N$ layers having a thickness of 2.5 nm. According to such a semiconductor light-emitting element as disclosed in PTD 1, crystal strain can be adjusted while suppressing dislocation or defect propagating from a substrate to the light-emitting portion, thus it is regarded that a semiconductor light-emitting element with a high efficiency can be provided.

Further, PTD 2 discloses a semiconductor light-emitting element in which an active layer constituted of the MQW structure having first through third quantum well layers QW1, QW2, QW3 is provided on an n-type contact layer, wherein an energy band gap of each quantum well layer is larger as the quantum well layer is located closer to the n-type contact layer, or the thickness of each quantum well layer is smaller as the quantum well layer is located closer to the n-type contact layer. According to such a semiconductor light-emitting element as disclosed in PTD 2, it is regarded that light absorption between quantum well layers QW1, QW2, QW3 is reduced to improve a luminous efficiency.

Further, PTD 3 discloses a III group nitride semiconductor light-emitting element including the MQW having first through fourth pair layers from a side of an n-AlGaN layer, wherein first through fourth well layers constituting the MQW are formed with such a growth condition of matching respective emission wavelengths with each other. Here, Si as impurities is added to the first through fourth well layers, and the added amount of Si is set so as to increase gradually from a side of an n-semiconductor layer toward a side of a p-semiconductor layer. Moreover, thicknesses of the first through fourth well layers are sized so as to degrease gradually from the side of the n-semiconductor layer toward the side of the p-semiconductor layer. Moreover, $In_x$ (X composition ratio) is set so as to decrease gradually from the side of the n-semiconductor layer toward the side of the p-semiconductor layer. According to such a III group nitride semiconductor light-emitting element as disclosed in PTD 3, it is regarded that the respective light-emission wavelengths of the well layers can be matched to obtain good color purity, and also the emission intensity can be enhanced.

Further, PTD 4 discloses a nitride semiconductor light-emitting element including thin first well layers (five layers) which emit light efficiently at a low current density and a thick second well layer (one layer) which emits light efficiently at a large current density, wherein the second well layer having crystallinity which is prone to deteriorate includes a light-emitting region 17 which is arranged between the first well layers and a p-type gallium nitride-based semiconductor region and constituted of the MQW structure. According to such a nitride semiconductor light-emitting element as disclosed in PTD 4, it is regarded that dependency of luminous efficiency with respect to the current density can be adjusted.

PATENT DOCUMENT

PTD 1: Japanese Patent Laying-Open No. 2012-69901
PTD 2: Japanese Patent Laying-Open No. 2008-103711
PTD 3: Japanese Patent Laying-Open No. 2007-281257
PTD 4: Japanese Patent Laying-Open No. 2007-115753

SUMMARY OF THE INVENTION

In recent years, a nitride semiconductor light-emitting element has been demanded which is driven at a large current density ((current value)/(area of light-emitting layer)). However, there has been a problem that a current-luminous efficiency (W/A), which is a ratio of a light emission amount to an applied current, and a power-luminous efficiency (W/W), which is a ratio of a light emission amount to an applied power, are lowered when a conventional nitride semiconductor light-emitting element is driven at a large current density.

In view of the circumstance described above, an object of the present invention is to provide a nitride semiconductor light-emitting element capable of improving the luminous efficiency during driving at a large current density.

The present invention is a nitride semiconductor light-emitting element including an n-type nitride semiconductor layer, a p-type nitride semiconductor layer, and a multiple quantum well light-emitting layer provided between the n-type nitride semiconductor layer and the p-type nitride semiconductor layer. The multiple quantum well light-emitting layer includes a second light-emitting layer, a third barrier layer, and a first light-emitting layer from a side close to the p-type nitride semiconductor layer. The first light-emitting layer includes a plurality of first quantum well layers and a first barrier layer provided between the plurality of first quantum well layers. The second light-emitting layer includes a plurality of second quantum well layers and a second barrier layer provided between the plurality of second quantum well layers. The second quantum well layers are thicker than the first quantum well layers. With such a configuration, a nitride semiconductor light-emitting element can be provided which is capable of improving a luminous efficiency during driving at a large current density. Further, the number of the second quantum well layers is preferably two. In this case, the luminous efficiency can be further improved during driving at a large current density.

According to the present invention, a nitride semiconductor light-emitting element can be provided which is capable of improving a luminous efficiency during driving at a large current density.

BRIEF DESCRIPTION OF THE DRAWINGS

FIG. 2 is a plan view schematically representing the nitride semiconductor light-emitting element of the embodiment shown in FIG. 1, viewed from above.

FIG. 3 represents one example of a band gap energy of a multiple quantum well light-emitting layer used for the nitride semiconductor light-emitting element of the embodiment.

FIG. 4 schematically illustrates an injection state of holes in a second quantum well layer at a room temperature (25° C.) and at a high temperature (80° C.).

DETAILED DESCRIPTION OF THE INVENTION

Figure 1:
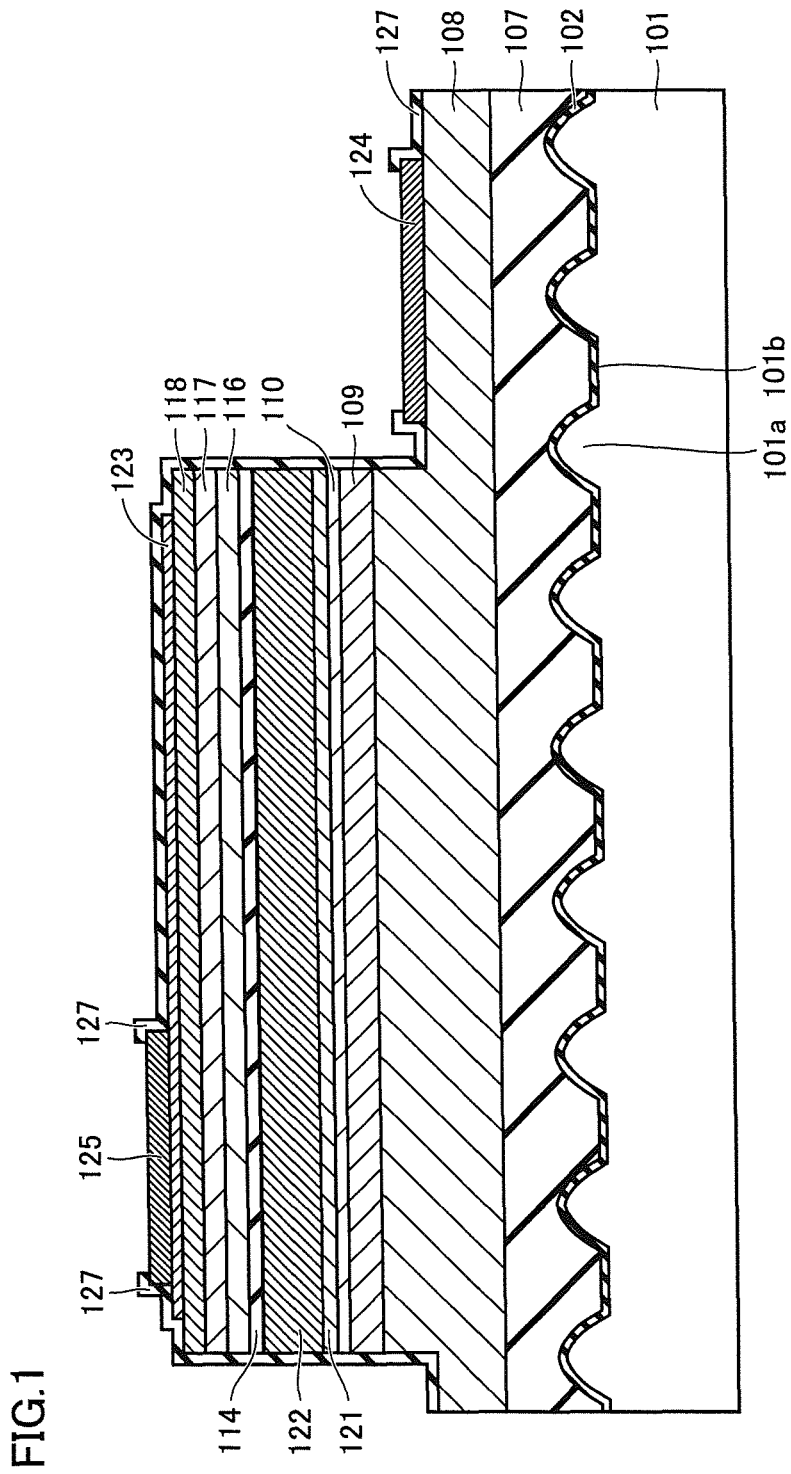
FIG. 1 is a cross-sectional view schematically representing a nitride semiconductor light-emitting element of an embodiment.

Hereinafter, an embodiment of the present invention will be described. It should be noted that, in the drawings of the present invention, the same reference numerals represent the same parts or corresponding parts.

Further, in the description, a "barrier layer" refers to a layer sandwiched between quantum well layers. A layer which is not sandwiched between quantum well layers is described as a "primary barrier layer" or a "last barrier layer" so that description is distinguished from the layer sandwiched between the quantum well layers.

Further, in this description, the term "dopant concentration" and the term "carrier concentration" which is a concentration of electrons and holes generated by doping of an n-type dopant or a p-type dopant are used. The relationship between these terms will be described later.

Further, in this description, a "carrier gas" refers to gas other than a III group source gas, a V group source gas, and a dopant source gas. Atoms constituting the carrier gas are not brought into the nitride semiconductor layer and the like.

Further, the "n-type nitride semiconductor layer" may include therein an n-type layer with a low carrier concentration or an undoped layer having a thickness which practically does not hamper a flow of electrons.

Further, the "p-type nitride semiconductor layer" may also include therein a p-type layer with a low carrier concentration or an undoped layer having a thickness which practically does not hamper a flow of holes. The wording "practically does not hamper" means that an operation voltage of the nitride semiconductor light-emitting element is at a practical level.

FIG. 1 is a cross-sectional view schematically representing a nitride semiconductor light-emitting element of the embodiment as one example of the nitride semiconductor light-emitting element of the present invention. FIG. 2 is a plan view schematically representing the nitride semiconductor light-emitting element of the embodiment shown in FIG. 1, viewed from above.

The nitride semiconductor light-emitting element of the present embodiment includes a substrate 101, and a buffer layer 102, a nitride semiconductor underlying layer 107, a lower n-type nitride semiconductor layer 108, an n-type nitride semiconductor modulation-doped layer 109, a low-temperature n-type nitride semiconductor layer 110, an n-type nitride semiconductor multilayer structure 121, an n-type nitride semiconductor intermediate layer (superlattice layer) 122, a multiple quantum well light-emitting layer 114, a p-type nitride semiconductor layer 116, a p-type nitride semiconductor layer 117, and a p-type nitride semiconductor layer 118, which are provided sequentially on substrate 101.

A transparent electrode layer 123 is provided on p-type nitride semiconductor layer 118, and a p-electrode 125 is provided on transparent electrode layer 123. Further, an n-electrode 124 is provided on p-type nitride semiconductor layer 118. Further, a surface of the nitride semiconductor light-emitting element is covered with a transparent insulating protective film 127 so as to expose a part of a surface of n-electrode 121 and a part of a surface of p-electrode 125.

Substrate 101 may be, for example, an insulative substrate made of sapphire or a conductive substrate made of GaN, SiC, or ZnO. The thickness of substrate 101 is not particularly limited. However, the thickness of substrate 101 during a growth of the nitride semiconductor layer is preferably larger than or equal to 900 μm and smaller than or equal to 1200 μm, and the thickness of substrate 101 during a use of the nitride semiconductor light-emitting element is preferably larger than or equal to 50 μm and smaller than or equal to 300 μm.

On an upper surface of substrate 101, protrusions 101*a* and recesses 101*b* are formed, so that irregularities are formed. The shapes of protrusions 101*a* and recesses 101*b* are not particularly limited. However, protrusions 101*a* preferably have an approximately circular shape arranged on apexes of an approximately equilateral triangle in a planar view, and a distance between of apexes of adjacent protrusions 101*a* is preferably larger than or equal to 1 μm and smaller than or equal to 5 μm. Further, a cross-sectional shape of protrusion 101*a* may be trapezoidal, more preferably is a shape of a trapezoid with a rounded apex portion.

Substrate 101 may be removed after the growth of the nitride semiconductor layer on substrate 101, so that the nitride semiconductor light-emitting element of the present invention may be a nitride semiconductor light-emitting element having no substrate 101.

A nitride semiconductor layer expressed by the formula of $Al_{s0}Ga_{t0}In_{u0}N_{1-u0}$ ($0 \leq s0 \leq 1$, $0 \leq t0 \leq 1$, $0 \leq u0 \leq 1$, $s0+t0 \neq 0$) is preferably used as buffer layer 102. More preferably, an AlN layer or an AlON layer is used.

Herein, as to the AlON layer constituting buffer layer 102, only a small fraction of N (higher than or equal to 0.5 atomic % and lower than or equal to 2 atomic %) is preferably replaced by oxygen. In this case, since buffer layer 102 is formed so as to extend in a normal direction of a growth surface of substrate 101, buffer layer 102 composed of an aggregate of columnar crystals having uniformly arranged crystal grains can be obtained.

The thickness of buffer layer 102 is not particularly limited, but is preferably larger than or equal to 3 nm and smaller than or equal to 100 nm, more preferably larger than or equal to 5 nm and smaller than or equal to 50 nm.

In order to improve a half width of an X-ray rocking curve of nitride semiconductor underlying layer 107 described later, an AlON layer formed by a known sputtering method is preferably used as buffer layer 102.

Nitride semiconductor underlying layer 107 can be formed on the surface of buffer layer 102 by for example an MOCVD (Metal Organic Chemical Vapor Deposition) method.

For example, a layer constituted of a III group nitride semiconductor expressed by the formula of $Al_{x0}Ga_{y0}In_{z0}N$ ($0 \leq x0 \leq 1$, $0 \leq y0 \leq 1$, $0 \leq z0 \leq 1$, $x0+y0+z0 \neq 0$) can be used as nitride semiconductor underlying layer 107.

A nitride semiconductor layer containing Ga as a III group element is preferably used as nitride semiconductor underlying layer 107 so as not to take over a crystal defect such as dislocation in buffer layer 102 constituted of an aggregate of columnar crystals.

Nitride semiconductor underlying layer 107 may be doped with an n-type dopant in the range of higher than or equal to $1 \times 10^{17}$ atoms/cm$^3$ and lower than or equal to $1 \times 10^{19}$ atoms/cm$^3$. However, in a view point of maintaining a good crystallinity of nitride semiconductor underlying layer 107, nitride semiconductor underlying layer 107 is preferably undoped.

The n-type dopant to be doped in nitride semiconductor underlying layer 107 may be of at least one kind selected from the group consisting of, for example, Si, Ge, and Sn. In particular, Si is preferably used as the n-type dopant. When Si is used as the n-type dopant to be doped in nitride semiconductor underlying layer 107, silane or disilane is preferably used as an n-type doping gas.

The temperature of substrate 101 during the growth of nitride semiconductor underlying layer 107 is preferably higher than or equal to 800° C. and lower than or equal to 1250° C., more preferably higher than or equal to 900° C. and lower than or equal to 1150° C. When the temperature of substrate 1 during the growth of nitride semiconductor underlying layer 107 is higher than or equal to 800° C. and lower than or equal to 1250° C., particularly when the temperature is higher than or equal to 900° C. and lower than or equal to 1150° C., nitride semiconductor underlying layer 107 with a superior crystallinity having less crystal defect can be grown.

Setting the thickness of nitride semiconductor underlying layer 107 to be as large as possible can reduce the defect in nitride semiconductor underlying layer 107. However, even when the thickness of nitride semiconductor underlying layer 107 is increased at some extent or more, a defect reducing effect in nitride semiconductor underlying layer 107 is saturated. Thus, the thickness of nitride semiconductor underlying layer 107 is preferably larger than or equal to 1 μm and smaller than or equal to 8 μm, more preferably larger than or equal to 3 μm and smaller than or equal to 5 μm.

For example, a layer having an n-type dopant doped in a layer constituted of a III group nitride semiconductor expressed by the formula of $Al_{x1}Ga_{y1}In_{z1}N$ ($0 \leq x1 \leq 1$, $0 \leq y1 \leq 1$, $0 \leq z1 \leq 1$, $x1+y1+z1 \neq 0$) can be used as lower n-type nitride semiconductor layer 108. In particular, a layer having an n-type dopant doped in an $Al_{x2}Ga_{1-x2}N$ ($0 \leq x2 \leq 1$, preferably $0 \leq x2 \leq 0.5$, more preferably $0 \leq x2 \leq 0.1$) layer is more preferably used as lower n-type nitride semiconductor layer 108.

The n-type dopant to be doped in lower n-type nitride semiconductor layer 108 is not particularly limited, but may be of at least one kind selected from the group consisting of, for example, Si, P, As, and Sb. In particular, Si is preferably used as the n-type dopant. This similarly applies to the layer which will be described later. An n-type dopant concentration of lower n-type nitride semiconductor layer 108 is not particularly limited, but is preferably smaller than or equal to $1 \times 10^{19}$ atoms/cm$^3$.

Setting the thickness of lower n-type nitride semiconductor layer 108 to be as large as possible can reduce a resistance of lower n-type nitride semiconductor layer 108. On the other hand, setting the thickness of lower n-type nitride semiconductor layer 108 to be large causes a rise in a production cost for the nitride semiconductor light-emitting element. In view of balancing both, the thickness of lower n-type nitride semiconductor layer 108 is preferably larger than or equal to 1 μm and smaller than or equal to 10 μm, but is not particularly limited.

In the Example which will be described later, lower n-type nitride semiconductor layer 108 is formed by two growth steps of stopping the growth of the n-type GaN layer once and growing the same n-type GaN layer again. However, the configuration of lower n-type nitride semiconductor layer 108 is not particularly limited.

For example, lower n-type nitride semiconductor layer 108 may be a single layer or a plurality of layers including two or more layers. When lower n-type nitride semiconductor layer 108 is constituted of a plurality of layers, the layers may have the same composition, or at least one layer may have a different composition. When lower n-type nitride semiconductor layer 108 is constituted of a plurality of layers, the layers may have an equal thickness, or at least one layer may have a different thickness.

The n-type nitride semiconductor layers other than lower n-type nitride semiconductor layer 108 (n-type nitride semiconductor modulation-doped layer 109, low-temperature n-type nitride semiconductor layer 110, n-type nitride semiconductor multilayer structure 121, and n-type nitride semiconductor intermediate layer (superlattice layer) 122) may be a single layer, or may be a plurality of layers having different compositions and/or dopant concentrations.

In the present embodiment, the n-type nitride semiconductor layers other than lower n-type nitride semiconductor layer 108 are n-type nitride semiconductor modulation-doped layer 109, low-temperature n-type nitride semiconductor layer 110, n-type nitride semiconductor multilayer structure 121, and n-type nitride semiconductor intermediate layer (superlattice layer) 122, but are obviously not limited to these, and it is not always necessary to form these layers.

Since description as to n-type nitride semiconductor modulation-doped layer 109, low-temperature n-type nitride semiconductor layer 110, n-type nitride semiconductor multilayer structure 121, and n-type nitride semiconductor intermediate layer (superlattice layer) 122 other than description provided above is the same as the description of lower n-type nitride semiconductor layer 108, the description will be omitted.

FIG. 3 represents one example of a band gap energy of multiple quantum well light-emitting layer 114 used for the nitride semiconductor light-emitting element of the present embodiment. The vertical axis in FIG. 3 shows a thickness in a stacking direction, and the upward direction indicates the side close to the p-type nitride semiconductor layer. Further, the horizontal axis in FIG. 3 shows a magnitude of the band gap energy, and the rightward direction indicates that the band gap energy is larger.

As shown in FIG. 3, multiple quantum well light-emitting layer 114 includes a second light-emitting layer 142, a third barrier layer 14U, and a first light-emitting layer 141 from a side close to the p-type nitride semiconductor layer.

First light-emitting layer 141 includes a plurality of first quantum well layers 14W (14W1, 14W2, 14W3, 14W4, 14W5, 14W6) and a plurality of first barrier layers 14A (14A1, 14A2, 14A3, 14A4, 14A5). First quantum well layers 14W and first barrier layers 14A are stacked alternately, and first barrier layers 14A are sandwiched between the plurality of first quantum well layers 14W, respectively.

Second light-emitting layer 142 includes a plurality of second quantum well layers 14V (14V1, 14V2) and a second barrier layer 14B1 provided between the plurality of second quantum well layers 14V.

A primary barrier layer 14AZ is provided directly on n-type nitride semiconductor intermediate layer (superlattice layer) 122. A last barrier layer 14A0 is provided directly on second quantum well layer 14V1 which is located on a side closest to a side of p-type nitride semiconductor layer 16.

It should be noted that, for the purpose of distinguishing each barrier layer and each quantum well layer, numbers are allotted from p-type nitride semiconductor layer 16 to n-type nitride semiconductor intermediate layer (superlattice layer) 122, in this description. For example, the layers are represented as first quantum well layer 14W1, first barrier layer 14A1, first quantum well layer 14W2, first barrier layer 14A2, and so on, second quantum well layer 14V1, second barrier layer 14B1, second quantum well layer 14V2, second barrier layer 14B2, and so on.

On the other hand, each barrier layer and each quantum well layer are collectively represented as a first barrier layer 14A, a second barrier layer 14B, a first quantum well layer 14W, and a second quantum well layer 14V, except for the case of particularly limiting to an individual layer. Further, in the present embodiment, an example is given in which two layers of second quantum well layers 14V and one layer of second barrier layer 14B are provided. However, it may be configured such that three or more second quantum well layers 14V and two or more second barrier layers 14B are provided.

In first light-emitting layer 141, first barrier layers 14A may include one or more semiconductor layers which are different from first barrier layers 14A and first quantum well layers 14W between first barrier layers 14A and first quantum well layers 14W as long as first barrier layers 14A are sandwiched between the plurality of first quantum well layers 14W. Further, a length of one cycle of first light-emitting layer 141 (a sum of a thickness of first barrier layer 14A and a thickness of first quantum well layer 14W) can be, for example, larger than or equal to 5 nm and smaller than or equal to 100 nm.

Similarly in second light-emitting layer 142, second barrier layer 14B may include one or more semiconductor layer which is different from second barrier layer 14B and second quantum well layers 14V between second barrier layer 14B and second quantum well layers 14V as long as second barrier layer 14B is sandwiched between the plurality of second quantum well layers 14V.

A thickness $t_2$ of second quantum well layer 14V in second light-emitting layer 142 is set to be larger than a thickness $t_1$ of first quantum well layer 14W in first light-emitting layer 141. Further, a difference between thickness $t_2$ of second quantum well layer 14V and thickness $t_1$ of first quantum well layer 14W is preferably smaller than or equal to 2.5 nm. In this case, the luminous efficiency of the nitride semiconductor light-emitting element during driving at a large current density can be improved. Further, each of second quantum well layers 14V1, 14V2 may be formed to have a different thickness, but preferably has the equal thickness. When the difference between thickness $t_1$ of first quantum well layer 14W and thickness $t_2$ of second quantum well layer 14V is set to be excessively large, a deviation in an emission wavelength of the nitride semiconductor light-emitting element becomes larger, thus it is not preferable.

The inventors found out that, when the thickness of second quantum well layer 14V is set to be larger than first quantum well layer 14W, the luminous efficiency of the nitride semiconductor light-emitting element during a high-temperature operation (during driving at a large current density) improves. Although the detailed principle of this effect is no clear, it is presumed as follows.

FIG. 4 schematically illustrates an injection state of holes in second quantum well layers 14V at a room temperature (25° C.) and at a high temperature (80° C.). In other words, when the thickness of second quantum well layer 14V is set to be larger than that of first quantum well layer 14W, most holes entered only into upper one or two layers in the whole quantum well layer at the room temperature (25° C.). Particularly in second quantum well layers 14V, when the thickness of second quantum well layer 14V1 close to p-type nitride semiconductor layer 16 is set to be large, an area of a region having many holes is extended, so that a light-emission volume increases. However, even when the thickness of second quantum well layer 14V2 is set to be large in a similar manner, an expected effect could not be obtained. It is considered that this occurs because the majority of the holes contribute to the light emission at the first layer in the quantum well layer. It is also conceivable that setting the thickness of the second layer rather deteriorates the crystallinity of the upper layer.

However, in the high-temperature region of higher than or equal to 80° C. (for example, during driving at a large current density), the holes are injected not only to second quantum well layer 14V1 which is close to p-type nitride semiconductor layer 16 among second quantum well layers 14V but also to the second layer (second quantum well layer 14V2) and subsequent layers. Therefore, a decline in the holes serving as a carrier becomes smaller as compared to the case where only second quantum well layer 14V1 is thick, thus an optical output is improved, and the temperature characteristic is improved.

A thickness $t_4$ of second barrier layer 14B in second light-emitting layer 142 is preferably smaller than a thickness $t_3$ of third barrier layer 14U. More preferably, a difference between thickness $t_3$ of third barrier layer 14U and thickness $t_4$ of second barrier layer 14B is smaller than or equal to 2 nm. There is a tendency that an optical output of the nitride semiconductor light-emitting element tends to rise as thickness $t_4$ of second barrier layer 14B is set smaller. Particularly, taking into consideration the driving at a room temperature, setting thickness $t_4$ of second barrier layer 14B to be smaller raises a ratio of holes serving as a carrier. However, when thickness $t_4$ of second barrier layer 14B is set to be excessively small, the crystallinity of second quantum well layer 14V stacked on second barrier layer 14B tends to be deteriorated, and the temperature characteristic also tends to be deteriorated. Therefore, the difference between thickness $t_3$ of third barrier layer 14U and thickness $t_4$ of second barrier layer 14B is preferably set to be smaller than or equal to 2 nm. Further, taking into consideration the crystallinity, two second quantum well layers 14V are preferably provided. Further, thickness $t_3$ of third barrier layer 14U is preferably formed to be equal to the thickness of first barrier layer 14A.

The plurality of second quantum well layers 14V1, 14V2 have a larger band gap energy than first quantum well layers 14W (FIG. 4, (i)). When second quantum well layer 14V is formed to be thicker than first quantum well layer 14W as described above without adjusting the band gap energy of first quantum well layers 14W and the plurality of second quantum well layers 14V1, 14V2, a second peak caused by second quantum well layers 14V appears on a short-wavelength side in the emission wavelength region of the nitride semiconductor light-emitting element. Therefore, a half width of a light-emission peak in the nitride semiconductor light-emitting element becomes large, and may deviate from a desired emission wavelength. On the other hand, a half width of a light-emission peak in the nitride semiconductor light-emitting element can be narrowed by setting the band gap energy of second quantum well layer 14V to be larger than first quantum well layer 14W and matching the emission wavelength of second quantum well layers 14V to that of first quantum well layers 14W, so that the emission wavelength of the nitride semiconductor light-emitting element can be matched with a desired value.

Further, in the plurality of second quantum well layers 14V1, 14V2, it is preferable that second quantum well layer 14V1 on a side close to p-type nitride semiconductor layer 16 preferably has a smaller band gap energy than second quantum well layer 14V2 on a side far from p-type nitride semiconductor layer 16 (FIG. 4, (ii)). As described above, with the configuration in which second quantum well layer 14V1 which is close to p-type nitride semiconductor layer 16 can retain more holes, matching with actual distribution of the holes can be performed, so that the luminous efficiency of the nitride semiconductor light-emitting element during driving at a large current density can be improved further.

Further, thickness $t_2$ of second quantum well layer 14V can be set large on appearance by setting thickness $t_4$ of second barrier layer 14B to be small. Consequently, the second peak caused by second quantum well layer 14V can be shifted to a long-wavelength side (FIG. 4, (iii)). By a combination with the adjustment of the band gap energy of each layer described above, the emission wavelength of the nitride semiconductor light-emitting element can be matched with a desired optimal value.

As described above, the light-emission peak wavelength of the nitride semiconductor light-emitting element can be matched with a desired value with adjustment of the band gap energy by adjusting the compositions of first quantum well layers 14W and second quantum well layers 14V to a light-emission peak wavelength required for the nitride semiconductor light-emitting element.

As first quantum well layers 14W, nitride semiconductor layers expressed for example by the formula of $Al_{c1}Ga_{d1}In_{(1-c1-d1)}N$ ($0 \le c1 < 1$, $0 < d1 \le 1$) can be used, independently. As second quantum well layers 14V, nitride semiconductor layers expressed for example by the formula of $Al_{c2}Ga_{d2}In_{(1-c2-d2)}N$ ($0 \le c2 < 1$, $0 < d2 \le 1$) can be used, independently.

Particularly, first quantum well layers 14W are preferably made of $In_{e1}Ga_{(1-e1)}N$ ($0 < e1 \le 1$) not containing Al, and second quantum well layers 14V are preferably made of $In_{e2}Ga_{(1-e2)}N$ ($0 < e2 \le 1$, $e1 > e2$) not containing Al. The band gap energy of first quantum well layers 14W and second quantum well layers 14V can be adjusted by changing the composition of In. When an ultraviolet light having a wavelength of less shorter or equal to 375 nm is to be emitted, it is necessary to set the band gap energy of multiple quantum well light-emitting layer 114 to be large. Therefore, each first quantum well layer 14W and each second quantum well layer 14V contain Al.

An In composition ratio of each first quantum well layer 14W is preferably set to be higher than an In composition ratio of each second quantum well layer 14V. Further, second quantum well layer 14V1 on a side close to p-type nitride semiconductor layer 16 preferably has a higher In composition ratio than second quantum well layer 14V2 on a side far from p-type nitride semiconductor layer 16. In this case, the luminous efficiency of the nitride semiconductor light-emitting element during driving at a large current density can be improved further.

When a two-layer structure is provided in which second quantum well layers 14V are arranged from the side close to p-type nitride semiconductor layer 16 in the order of second quantum well layer 14V1 and second quantum well layer 14V2, an In composition ratio of second quantum well layer 14V1 is set to be higher than an In composition ratio of second quantum well layer 14V2. Accordingly, with the configuration in which second quantum well layer 14V1 on a side close to p-type nitride semiconductor layer 16 can retain more holes, matching with actual distribution of the holes can be performed, so that the luminous efficiency of the nitride semiconductor light-emitting element during driving at a large current density can be improved further. Several approaches can be conceived as specific methods for adjusting the In composition ratio. For example, a method of adjusting a temperature during formation of each quantum well layer can be conceived.

Since the band gap energy of second quantum well layer 14V can be set larger than that of first quantum well layer 14W by adjusting the composition of In, a half width of a light-emission peak in the nitride semiconductor light-emitting element can be narrowed by matching the emission wavelength of second quantum well layer 14V with first quantum well layer 14W, so that the emission wavelength of the nitride semiconductor light-emitting element can be matched with a desired value. Further, since the In composition ratio of second quantum well layer 14V1 on a side close to p-type nitride semiconductor layer 16 is set to be higher than that of second quantum well layer 14V2, second quantum well layer 14V1 on a side close to p-type nitride semiconductor layer 16 has a smaller band gap energy, and second quantum well layers 14V on the side close to p-type nitride semiconductor layer 16 can retain more holes, so that matching with actual distribution of holes can be performed.

Among the plurality of first quantum well layers 14W, first quantum well layer 14W located on the side of p-type nitride semiconductor layer 16 preferably does not contain a dopant utmost. In other words, first quantum well layer 14W located on the side of p-type nitride semiconductor layer 16 is preferably grown without introduction of a dopant material. Accordingly, since non-emitting recombination becomes less likely to occur in each first quantum well layer 14W, the luminous efficiency of the nitride semiconductor light-emitting element during driving at a large current density can be improved.

Among the plurality of first quantum well layers 14W, first quantum well layer 14W located on a side of substrate 101 may contain an n-type dopant. Accordingly, a driving voltage of the nitride semiconductor light-emitting element tends to be lowered.

The thicknesses of first quantum well layers 14W are not particularly limited, but are preferably equal. When the thicknesses of first quantum well layers 14W are equal, quantum levels of first quantum well layers 14W also become equal, so that recombination of electrons and holes in each first quantum well layer 14W generates light having an equal wavelength in each first quantum well layer 14W. Therefore, it is preferable because an emission spectrum width of the nitride semiconductor light-emitting element is narrowed.

On the other hand, when the compositions and/or thicknesses of first quantum well layers 14W are intentionally differed, the nitride semiconductor light-emitting element can have a broader emission spectrum width. When the nitride semiconductor light-emitting element is used in lighting or the like, it is preferable that the compositions and/or thicknesses of first quantum well layers 14W are intentionally differed. Each first quantum well layer 14W preferably has a thickness of larger than or equal to 1 nm and smaller than or equal to 7 nm. When the thickness of each first quantum well layer 14W falls within the range of larger than or equal to 1 nm and smaller than or equal to 7 nm, the luminous efficiency of the nitride semiconductor light-emitting element during driving at a large current density can be further improved.

First barrier layers 14A (14A1 to 14A5), second barrier layer 14B1, third barrier layer 14U, primary barrier layer 14AZ, and last barrier layer 14A0 are preferably made of a nitride semiconductor material having a band gap energy which is larger than that of a nitride semiconductor material constituting each first quantum well layer 14W and each second quantum well layer 14V.

First barrier layers 14A (14A1 to 14A5), second barrier layer 14B1, third barrier layer 14U, primary barrier layer 14AZ, and last barrier layer 14A0 preferably are nitride semiconductor layers expressed by the formula of $Al_f Ga_g In_{(1-f-g)}N$ ($0 \leq f < 1$, $0 < g \leq 1$), independently, and more preferably are nitride semiconductor layers expressed by the formula of $In_h Ga_{(1-h)}N$ ($0 < h \leq 1$, $e1 > e2 > h$) containing no Al.

The thickness of each first barrier layer 14A is not particularly limited, but is preferably larger than or equal to 1 nm and smaller than or equal to 10 nm, and more preferably larger than or equal to 3 nm and smaller than or equal to 7 nm. A driving voltage is lowered as the thickness of each first barrier layer 14A is smaller. However, when the thickness of each first barrier layer 14A is set to be excessively small, the luminous efficiency of the nitride semiconductor light-emitting element during driving at a large current density tends to be lowered. The thickness of primary barrier layer 14AZ is not particularly limited, but is preferably larger than or equal to 1 nm and smaller than or equal to 10 nm. The thickness of last barrier layer 14A0 is not particularly limited, but is preferably larger than or equal to 1 nm and smaller than or equal to 40 nm.

The n-type dopant concentrations in first barrier layers 14A (14A1 to 14A5), second barrier layer 14B1, third barrier layer 14U, and primary barrier layer 14AZ are not particularly limited, and is preferably set in an appropriate manner as needed. Further, among the plurality of first barrier layers 14A, it is preferable that first barrier layer 14A located on a side of substrate 101 is doped with an n-type dopant, and that first barrier layer 14A, second barrier layer 14B1, and third barrier layer 14U on the side of p-type nitride semiconductor layer 16 are doped with or not doped with an n-type dopant having a concentration which is lower than that of first barrier layer 14A located on the side of substrate 101.

Each first barrier layer 14A, second barrier layer 14B1, third barrier layer 14U, primary barrier layer 14AZ, and last barrier layer 14A0 are doped with an n-type dopant intentionally in some cases. Further, each first barrier layer 14A, second barrier layer 14B1, third barrier layer 14U, primary barrier layer 14AZ, and last barrier layer 14A0 are doped with a p-type dopant by means of heat radiation during the growth of p-type nitride semiconductor layer 16, p-type nitride semiconductor layer 17, and p-type nitride semiconductor layer 18 in some cases.

The number of layers of first quantum well layers 14W is not particularly limited, but is preferably more than or equal to two layers and less than or equal to twenty layers, more preferably more than or equal to three layers and less than or equal to fifteen layers, yet more preferably more than or equal to four layers and less than or equal to twelve layers.

P-type nitride semiconductor layers 116, 117, 118 are preferably the layers having a p-type dopant doped, for example, in $Al_{s4} Ga_{t4} In_{u4} N$ ($0 \leq s4 \leq 1$, $0 \leq t4 \leq 1$, $0 \leq u4 \leq 1$, $s4+t4+u4 \neq 0$) layers, more preferably the layers having a p-type dopant doped in $Al_{s4} Ga_{(1-s4)} N$ ($0 < s4 \leq 0.4$, preferably $0.1 \leq s4 \leq 0.3$) layers.

The p-type dopant is not particularly limited, but is preferably magnesium, for example. The carrier concentration in p-type nitride semiconductor layers 116, 117, 118 is preferably higher than or equal to $1 \times 10^{17}$ atoms/cm$^3$. Since an activating rate of the p-type dopant is approximately 0.01, the p-type dopant concentration (which is different from the carrier concentration) in p-type nitride semiconductor layers 116, 117, 118 is preferably higher than or equal to $1 \times 10^{19}$ atoms/cm$^3$. However, among p-type nitride semiconductor layers 116, 117, 118, the p-type dopant concentration in p-type nitride semiconductor layer 116 located on a side of multiple quantum well light-emitting layer 114 is preferably lower than $1 \times 10^{19}$ atoms/cm$^3$.

The total thickness of p-type nitride semiconductor layers 116, 117, 118 is not particularly limited, but is preferably larger than or equal to 50 nm and smaller than or equal to 300 nm. Reducing the total thickness of p-type nitride semiconductor layers 116, 117, 118 can shorten a heating time during the growth of p-type nitride semiconductor layers 116, 117, 118. Accordingly, diffusion of the p-type dopant in p-type nitride semiconductor layers 116, 117, 118 can be suppressed.

N-electrode 124 and p-electrode 125 are electrodes for supplying driving power to the nitride semiconductor light-emitting element. As shown in FIG. 2, n-electrode 124 and p-electrode 125 are constituted of pad electrode portions only. However, for example, an elongated protrusion (branch electrode) for current diffusion may be connected to n-electrode 124 and/or p-electrode 125.

Further, an insulating layer for preventing injection of current to p-electrode 125 is preferably provided under p-electrode 125. Accordingly, the amount of light emission blocked by p-electrode 125 is reduced.

N-electrode 124 is preferably constituted of, for example, a titanium layer, an aluminum layer, and a gold layer stacked in this order. When it is assumed that wire bonding is applied to n-electrode 124, the thickness of n-electrode 124 is preferably larger than or equal to 1 µm.

P-electrode 125 is preferably constituted of, for example, a nickel layer, an aluminum layer, a titanium layer, and a gold layer stacked in this order, and may be constituted of the same material as n-electrode 124. When it is assumed that wire bonding is applied to p-electrode 125, the thickness of p-electrode 125 is preferably larger than or equal to 1 µm.

Transparent electrode layer 123 is preferably a transparent conductive film made of, for example, ITO (Indium Tin Oxide) or IZO (Indium Zinc Oxide), and preferably has a thickness of larger than or equal to 20 nm and smaller than or equal to 200 nm.

The carrier concentration represents a concentration of electrons or holes, and is not determined only by the amount of n-type dopant or the amount of p-type dopant. Such a carrier concentration is calculated based on a result of a voltage-capacity characteristic of the nitride semiconductor light-emitting element and indicates a carrier concentration in the state where a current is not injected, and it is a sum total of ionized impurities, and carriers generated from crystal defects converted to donors and crystal defects converted to acceptors.

However, the n-type carrier concentration can be considered as being substantially the same as the n-type dopant concentration since the activating rate of Si or the like as the n-type dopant has a high activating rate. Further, the n-type dopant concentration can be readily calculated with an SIMS (Secondary Ion Mass Spectroscopy) by measuring the concentration distribution in the depth direction. Further, a relative (ratio) of the dopant concentration is substantially the same as a relative (ratio) of the carrier concentration. Therefore, means for solving the problem according to the present invention provides definition with the dopant concentration which can be readily measured in an actual practice. The n-type dopant concentration obtained by the measurement is averaged in the thickness direction to obtain an average n-type dopant concentration.

In the following, one example of a method for manufacturing the nitride semiconductor light-emitting element of the present embodiment will be described. Firstly, buffer layer 102 is formed on substrate 101 by, for example, a sputtering method or the like.

Next, for example, by an MOCVD method or the like, nitride semiconductor underlying layer 107, lower n-type nitride semiconductor layer 108, n-type nitride semiconductor modulation-doped layer 109, low-temperature n-type nitride semiconductor layer 110, n-type nitride semiconductor multilayer structure 121, n-type nitride semiconductor intermediate layer (superlattice layer) 122, multiple quantum well light-emitting layer 114, p-type nitride semiconductor layer 116, p-type nitride semiconductor layer 117, and p-type nitride semiconductor layer 118 are formed in this order on buffer layer 102.

Next, p-type nitride semiconductor layer 118, p-type nitride semiconductor layer 117, p-type nitride semiconductor layer 116, multiple quantum well light-emitting layer 114, n-type nitride semiconductor intermediate layer (superlattice layer) 122, n-type nitride semiconductor multilayer structure 121, low-temperature n-type nitride semiconductor layer 110, n-type nitride semiconductor modulation-doped layer 109, and lower n-type nitride semiconductor layer 108 are partially removed by etching so that a part of a surface of lower n-type nitride semiconductor layer 108 is exposed.

N-electrode 124 is formed on the surface of lower n-type nitride semiconductor layer 108 exposed by the etching. Further, transparent electrode layer 123 and p-electrode 125 are stacked in this order on an upper surface of p-type nitride semiconductor layer 118.

After that, transparent insulating protective film 127 is formed so as to cover transparent electrode layer 123 and a side of each layer exposed by the etching. Accordingly, the nitride semiconductor light-emitting element of the present embodiment having the configuration shown in FIG. 1 can be obtained.

EXAMPLE

Next, more specific example of the nitride semiconductor light-emitting element of the present embodiment will be described. The configuration of the nitride semiconductor light-emitting element of the present embodiment is not limited to the configuration of the nitride semiconductor light-emitting element of Example which will be described below.

Firstly, as shown in FIG. 1, substrate 101 which is a 100-mm-diameter sapphire substrate having a surface worked with unevenness constituted of protrusions 101a and recesses 101b was prepared. The shape of each protrusion 101a has an approximately circular shape in a planar view, and adjacent three protrusions 101a are arranged so as to be located on apexes of an approximately equilateral triangle in a planar view. A distance between apexes of adjacent protrusions 101a is 2 µm.

Further, a diameter of the approximate circle of protrusion 101a in a planar view was approximately 1.2 µm, and a height of protrusion 101a was approximately 0.6 µm. Further, protrusions 101a and recesses 101b on an upper surface of substrate 101 had the cross section shown in FIG. 1, and protrusions 101a had tip portions.

Next, after protrusions 101a and recesses 101b were formed, RCA cleaning was performed with respect to the upper surface of substrate 101. After the RCA cleaning, substrate 101 was placed in a chamber. Then, $N_2$, $O_2$, and Ar were introduced, and substrate 101 was heated to 650° C.

Next, in the mixed atmosphere of $N_2$, $O_2$, and Ar, a reactive sputtering method of sputtering an Al target was used to form, on the surface of substrate 101 having protrusions 101a and recesses 101b, buffer layer 102 having a thickness of 25 nm and composed of AlON crystals of an aggregate of columnar crystals having uniformly arranged crystal grains extending in the normal direction of the surface of substrate 101.

Next, substrate 101 having buffer layer 102 formed thereon was accommodated in a first MOCVD device. Then, by the MOCVD method, nitride semiconductor underlying layer 107 made of undoped GaN was grown on buffer layer 102, and lower n-type nitride semiconductor layer 108 made of Si-doped n-type GaN was successively grown on an upper surface of nitride semiconductor underlying layer 107. In this stage, the thickness of nitride semiconductor underlying layer 107 was set to be 4 µm, and the thickness of lower n-type nitride semiconductor layer 108 was set to be 3 µm, and the n-type dopant concentration in lower n-type nitride semiconductor layer 108 was set to be $1 \times 10^{19}$ atoms/cm$^3$.

Setting the thickness of nitride semiconductor underlying layer 107 to be as large as possible can reduce the defect in nitride semiconductor underlying layer 107. However, even when the thickness of nitride semiconductor underlying layer 107 was increased at some extent or more, a defect reducing effect in nitride semiconductor underlying layer 107 was saturated. Accordingly, it was found out that the thickness of nitride semiconductor underlying layer 107 is preferably larger than or equal to 1 µm and smaller than or equal to 8 µm, more preferably larger than or equal to 3 µm and smaller than or equal to 5 µm.

Next, substrate 101 taken out from the first MOCVD device was accommodated in a second MOCVD device. The temperature of substrate 101 was set to be 1081° C. (first growth temperature) to grow lower n-type nitride semiconductor layer 108 on nitride semiconductor underlying layer 107. Lower n-type nitride semiconductor layer 108 was an n-type GaN layer having an n-type dopant concentration of $1 \times 10^{19}$ atoms/cm$^3$, and the thickness thereof was 1.5 µm.

Next, in the state where the temperature of substrate 101 is maintained at 1081° C. (first growth temperature), the crystal growth of an n-type nitride semiconductor layer (n-type dopant concentration: $1 \times 10^{19}$ atoms/cm$^3$) having a thickness of 50 nm and made of Si-doped n-type GaN, a nitride semiconductor layer having a thickness of 87 nm and made of undoped GaN, an n-type nitride semiconductor layer (n-type dopant concentration: $1 \times 10^{19}$ atoms/cm$^3$) having a thickness of 50 nm and made of Si-doped n-type GaN, and a nitride semiconductor layer having a thickness of 87 nm and made of undoped GaN was conducted in this order by the MOCVD method on lower n-type nitride semiconductor layer 108, and n-type nitride semiconductor modulation-doped layer 109 was stacked.

Next, the temperature of substrate 101 was set to be 801° C. (second growth temperature), and low-temperature n-type nitride semiconductor layer 110 was grown on n-type nitride semiconductor modulation-doped layer 109. Specifically, an Si-doped GaN layer having a thickness of 25 nm was grown so as to have an n-type dopant concentration of $1 \times 10^{19}$ atoms/cm$^3$.

Next, in the state where the temperature of substrate 101 is maintained at 801° C. (third growth temperature), n-type nitride semiconductor multilayer structure 121 was grown on low-temperature n-type nitride semiconductor layer 110. Specifically, an Si-doped n-type InGaN layer having a thickness of 7 nm, an Si-doped n-type GaN layer having a thickness of 30 nm, an Si-doped n-type InGaN layer having a thickness of 7 nm, and an Si-doped n-type GaN layer having a thickness of 20 nm were stacked alternately by two layers after another to grow n-type nitride semiconductor multilayer structure 121. Each layer of n-type nitride semiconductor multilayer structure 121 had an n-type dopant concentration of $7 \times 10^{17}$ atoms/cm$^3$. Further, an In composition ratio of the InGaN layer was set to be equal to an In composition ratio of a narrow bandgap layer constituting n-type nitride semiconductor intermediate layer (superlattice layer) 122 to be subsequently grown.

Next, in the state where the temperature of substrate 101 is maintained at 801° C. (fourth growth temperature), n-type nitride semiconductor intermediate layer (superlattice layer) 122 was grown on n-type nitride semiconductor multilayer structure 121. Specifically, a wide bandgap layer constituted of an Si-doped n-type GaN layer and a narrow bandgap layer constituted of an Si-doped n-type InGaN layer were grown alternately for twenty cycles on n-type nitride semiconductor multilayer structure 121. The thickness of each wide bandgap layer was 2.05 nm. Further, the thickness of each narrow bandgap layer was 2.05 nm.

As to the n-type dopant concentrations in the wide bandgap layers, the five wide bandgap layers located on a side of multiple quantum well light-emitting layer 114 had the n-type dopant concentration of $1 \times 10^{19}$ atoms/cm$^3$, and the wide bandgap layer further on a side of substrate 101 had the n-type dopant concentration of 0 atoms/cm$^3$ (undoped).

Further, since a flow rate of TMI (trimethylindium) was adjusted so that a wavelength of light generated by photoluminescence is set to be 375 nm, composition of each narrow bandgap layer was $In_yGa_{1-y}N$ (y=0.04).

Next, the temperature of substrate 101 was lowered to 672° C. to grow multiple quantum well light-emitting layer 114 on n-type nitride semiconductor intermediate layer (superlattice layer) 122. Specifically, as shown in FIG. 3, after first barrier layers 14A (14A1 to 14A5) made of InGaN and first quantum well layers 14W (14W1 to 14W6) made of InGaN were grown alternately by one layer after another, third barrier layer 14U made of InGaN was grown. Further, after raising the temperature of substrate 101 to 678° C., second quantum well layer 14V1 made of InGaN and second barrier layer 14B1 made of InGaN were grown alternately one after another. Further, after lowering the temperature of substrate 101 to 677° C., second quantum well layer 14V2 made of InGaN was grown. Each of first barrier layer 14A, third barrier layer 14U, and second barrier layer 14B had a thickness of 4.52 nm. The n-type dopant concentration of primary barrier layer 14AZ and first barrier layers 14A5, 14A4 was $4.3 \times 10^{18}$ atoms/cm$^3$, and other first barrier layer 14A3, first barrier 14A2, first barrier 14A1, third barrier layer 14U, and second barrier layer 14B were undoped.

Further, when second barrier layer 14B is formed to have a thickness smaller than first barrier layer 14A and/or third barrier layer 14U, an optical output (Po) during driving at a large current density can be improved. Thickness $t_4$ of second barrier layer 14B1 in this case is preferably $0 < t_4 < 4.52$ nm, more preferably 3 nm $\leq t_4 < 4.52$ nm. When thickness $t_4$ of second barrier layer 14B1 is smaller than 3 nm, a function as a crystal recovery layer is insufficient, and the crystallinity of second quantum well layer 14V1 to be stacked next is lowered. Therefore, a desired optical output (Po) possibly cannot be obtained during driving at a large current density.

Further, when the n-type dopant is doped only to first barrier layer 14A1 with the concentration of higher than or equal to $4 \times 10^{17}$ atoms/cm$^3$ and lower than or equal to $4 \times 10^{18}$ atoms/cm$^3$, deterioration of the temperature characteristic in the nitride semiconductor light-emitting element can be suppressed. Therefore, an optical output (Po) of the nitride semiconductor light-emitting element during driving at a large current density can be improved.

The thickness of primary barrier layer 14AZ may have a thickness larger than first barrier layer 14A5 (for example, a thickness of 5.52 nm) for the purpose of forming a narrow bandgap layer located on a side in n-type nitride semiconductor intermediate layer (superlattice layer) 122 closest to multiple quantum well light-emitting layer 114 or for the purpose of allowing primary barrier layer 14AZ to have an effect of the wide bandgap layer not included in n-type nitride semiconductor intermediate layer (superlattice layer) 122.

Further, the n-type dopant concentration of primary barrier layer 14AZ may be $1 \times 10^{19}$ atoms/cm$^3$ in a lower portion of primary barrier layer 14AZ (in the region distanced from a lower surface of primary barrier layer 14AZ by 2.05 nm or larger), and may be $4.3 \times 10^{18}$ atoms/cm$^3$ in an upper portion of primary barrier layer 14AZ (in a portion other than the lower portion of primary barrier layer 14AZ).

Further, only a lower portion of first barrier layer 14A4 (for example, in a region distanced from the lower surface of first barrier layer 14A4 by 3.5 nm) may be doped with the n-type dopant, and an upper portion of first barrier layer 14A4 (in a portion other than the lower portion of first barrier layer 14A4) may be undoped. As described above, leaving the upper portion of first barrier layer 14A4 undoped can prevent a direct contact between injected carriers of first quantum well layer 14W4 and the barrier layer portion doped to be n-type.

For first quantum well layer 14W, a nitrogen gas as a carrier gas was used to grow an undoped $In_xGa_{1-x}N$ layer (x=0.20). The thickness of each first quantum well layer 14W was set to be 3.38 nm. Further, the flow rate of TMI was adjusted so that a wavelength of light emitted from first quantum well layer 14W by photoluminescence is set to be 448 nm, to thereby set a composition x of In in first quantum well layer 14W. The thickness of each second quantum well layer 14V was set to be 4.24 nm. It was found out that an optical output (Po) under the environment of the room temperature (25° C.) is improved by setting the thickness of second quantum well layer 14V to be larger than that of first quantum well layer 14W. Theoretically, even when the thickness of second quantum well layer 14V is set to have a considerably large thickness of approximately 10 to 15 nm, the effect of improving the optical output (Po) should be obtained. However, when the thickness of second quantum well layer 14V is set to be larger than or equal to 5.6 nm, the effect of improving the optical output (Po) under the environment of the room temperature (25° C.) could not be obtained.

Further, for second quantum well layer 14V, the thickness of each of second quantum well layer 14V1 and second quantum well layer 14V2 was set to be 4.0 nm. It was found out that, in this case, the optical output (Po) under the high temperature (80° C.) environment (during driving at a large current density) is further improved.

Further, the flow rate of TMI was adjusted so that the wavelength of light emitted from first quantum well layer 14W by photoluminescence is set to be 448 nm, to thereby set an In composition ratio in first quantum well layer 14W. The In composition ratio of each of second quantum well layers 14V1 and 14V2 was adjusted to an optimal value by adjusting the temperature of substrate 101 as mentioned above.

Next, last barrier layer 14A0 (thickness of 10 nm) made of undoped GaN layer was grown on uppermost first quantum well layer 14W1.

Next, the temperature of substrate 101 was raised to 1000° C. to grow a p-type $Al_{0.18}Ga_{0.82}N$ layer, a p-type GaN layer, and a p-type contact layer as p-type nitride semiconductor layers 116, 117, 118 on an upper surface of last barrier layer 14A0.

In the MOCVD growth of each layer described above, TMG (trimethylgallium) as a source gas of Ga, TMA (trimethylaluminum) as a source gas of Al, TMI (trimethylindium) as a source gas of In, and $NH_3$ as a source gas of N were used. Further, $SiH_4$ was used as a source gas of Si which is an n-type dopant, and $Cp_2Mg$ was used as a source gas of Mg which is a p-type dopant.

However, the source gas is not limited to the gas described above, and any kind of gas can be used as long as gas can be used as a source gas for MOCVD. Specifically, TEG (triethylgallium) as a source gas of Ga, TEA (triethylaluminum) as a source gas of Al, TEI (triethylindium) as a source gas of In, organic nitrogen compounds such as DMHy (dimethylhydrazine) as a source gas of N, and $Si_2H_6$ or organic Si as a source gas of Si can be used.

Then, a p-type contact layer (p-type nitride semiconductor layer 118), a p-type GaN layer (p-type nitride semiconductor layer 117), a p-type AlGaN layer (p-type nitride semiconductor layer 116), multiple quantum well light-emitting layer 114, n-type nitride semiconductor intermediate layer (superlattice layer) 122, n-type nitride semiconductor multilayer structure 121, low-temperature n-type nitride semiconductor layer 110, and n-type nitride semiconductor modulation-doped layer 109 were partially etched to expose a part of a surface of lower n-type nitride semiconductor layer 108. N-electrode 124 made of Au was formed on the upper surface of lower n-type nitride semiconductor layer 108 exposed by etching. Further, transparent electrode layer 123 made of ITO and p-electrode 125 made of Au were formed one another on an upper surface of p-type contact layer 118. Further, transparent insulating protective film 127 made of $SiO_2$ was formed so as to mainly cover transparent electrode layer 123 and a side of each layer exposed by the etching.

Next, substrate 101 was divided into chips having a size of 620×680 μm. Accordingly, the nitride semiconductor light-emitting element of Example could be obtained.

Further, a nitride semiconductor light-emitting element of Comparative Example was produced with the same features as the nitride semiconductor light-emitting element of Example, except for the features that each first quantum well layer 14W has a thickness of 3.38 nm, and each second quantum well layer 14V1 has a thickness of 3.38 nm.

As a result of driving the nitride semiconductor light-emitting element of Example and the nitride semiconductor light-emitting element of Comparative Example at a large current density of 120 mA/cm$^2$, the luminous efficiency of the nitride semiconductor light-emitting element of Example has improved by several % to 10% as compared to the luminous efficiency of the nitride semiconductor light-emitting element of Comparative Example.

The present invention is a nitride semiconductor light-emitting element including an n-type nitride semiconductor layer, a p-type nitride semiconductor layer, and a multiple quantum well light-emitting layer provided between the n-type nitride semiconductor layer and the p-type nitride semiconductor layer. The multiple quantum well light-emitting layer includes a second light-emitting layer, a third barrier layer, and a first light-emitting layer from a side close to the p-type nitride semiconductor layer. The first light-emitting layer includes a plurality of first quantum well layers and a first barrier layer provided between the plurality of first quantum well layers. The second light-emitting layer includes a plurality of second quantum well layers and a second barrier layer provided between the plurality of second quantum well layers. The second quantum well layers are thicker than the first quantum well layers. With such a configuration, a nitride semiconductor light-emitting element can be provided which is capable of improving a luminous efficiency during driving at a large current density. Further, the number of the second quantum well layers is preferably two. In this case, the luminous efficiency can be further improved during driving at a large current density.

Herein, in the nitride semiconductor light-emitting element of the present invention, the second barrier layer is preferably thinner than at least one of the first barrier layer and the third barrier layer. Further, the third barrier layer preferably has a thickness equal to that of the first barrier layer. With such a configuration, an optical output of the nitride semiconductor light-emitting element can be raised.

Further, in the nitride semiconductor light-emitting element of the present invention, the second quantum well layer preferably has a larger band gap energy than that of the first quantum well layer. With such a configuration, a half width of a light-emission peak of the nitride semiconductor light-emitting element can be narrowed, so that the emission wavelength of the nitride semiconductor light-emitting element can be matched with a desired value.

Further, in the nitride semiconductor light-emitting element of the present invention, the band gap energy is preferably smaller on a side close to the p-type nitride semiconductor layer in the plurality of second quantum well layers. With such a configuration, the luminous efficiency of the nitride semiconductor light-emitting element during driving at a large current density can be improved.

In the nitride semiconductor light-emitting element of the present invention, the first quantum well layers are preferably made of $Al_{c1}Ga_{d1}In_{1-c1-d1}N$ (0≤c1<1, 0<d1≤1), and the second quantum well layers are preferably made of $Al_{c2}Ga_{d2}In_{(1-c2-d2)}N$ (0≤c2<1, 0≤d2≤1), and the In composition ratio of the first quantum well layers is preferably higher than the In composition ratio of the second quantum well layer. With such a configuration, the luminous efficiency of the nitride semiconductor light-emitting element during driving at a large current density can be further improved.

Further, in the nitride semiconductor light-emitting element of the present invention, the In composition ratio is preferably higher on a side closer to the p-type nitride semiconductor layer in the plurality of second quantum well layers. With such a configuration, the luminous efficiency of the nitride semiconductor light-emitting element during driving at a large current density can be further improved.

It should be understood that the embodiments and examples disclosed herein are illustrative and non-restrictive in every respect. The scope of the present invention is defined by the terms of claims, and is intended to include any modifications within the scope and meaning equivalent to the terms of the claims.

The present invention can be utilized for a nitride semiconductor light-emitting element.

REFERENCE SIGNS LIST

14W, 14W1, 14W2, 14W3, 14W4, 14W5, 14W6 first quantum well layer; 14A, 14A1, 14A2, 14A3, 14A4, 14A5 first barrier layer; 14V, 14V1, 14V2 second quantum well layer; 14B1 second barrier layer; 14AZ primary barrier layer; 14A0 last barrier layer; 14U third barrier layer; 101 substrate; 101a protrusion; 101b recess; 102 buffer layer; 107 nitride semiconductor underlying layer; 108 lower n-type nitride semiconductor layer; 109 n-type nitride semiconductor modulation-doped layer; 110 low-temperature n-type nitride semiconductor layer; 114 multiple quantum well light-emitting layer; 116, 117, 118 p-type nitride semiconductor layer; 121 n-type nitride semiconductor multilayer structure; 122 n-type nitride semiconductor intermediate layer (superlattice layer); 123 transparent electrode layer; 124 n-electrode; 125 p-electrode; 127 transparent insulating protective film; 141 first light-emitting layer; 142 second light-emitting layer.

The invention claimed is:

1. A nitride semiconductor light-emitting element, comprising:
   an n-type nitride semiconductor layer;
   a p-type nitride semiconductor layer; and
   a multiple quantum well light-emitting layer provided between said n-type nitride semiconductor layer and said p-type nitride semiconductor layer,
   said multiple quantum well light-emitting layer including a second light-emitting layer, a third barrier layer, and a first light-emitting layer from a side close to said p-type nitride semiconductor layer,
   said first light-emitting layer including a plurality of first quantum well layers and a first barrier layer provided between said plurality of first quantum well layers,
   said second light-emitting layer including a plurality of second quantum well layers and a second barrier layer provided between said plurality of second quantum well layers,
   said second quantum well layers being thicker than said first quantum well layers,
   said second barrier layer being thinner than said first barrier layer, and
   said second barrier layer being thinner than said third barrier layer.

2. The nitride semiconductor light-emitting element according to claim 1, wherein said second quantum well layers have a larger band gap energy than said first quantum well layers.

3. The nitride semiconductor light-emitting element according to claim 2, wherein a band gap energy of said plurality of second quantum well layers is smaller on a side close to said p-type nitride semiconductor layer.

4. The nitride semiconductor light-emitting element according to claim 1, wherein said first quantum well layers are made of $Al_{c1}Ga_{d1}In_{(1-c1-d1)}N$ ($0 \leq c1 < 1$, $0 < d1 \leq 1$), and
   said second quantum well layers are made of $Al_{c2}Ga_{d2}In_{(1-c2-d2)}N$ ($0 \leq c2 < 1$, $0 < d2 \leq 1$), and
   an In composition ratio of said first quantum well layers is higher than an In composition ratio of said second quantum well layers.

* * * * *